(12) United States Patent
Lupashku et al.

(10) Patent No.: US 10,890,602 B2
(45) Date of Patent: Jan. 12, 2021

(54) UNIVERSAL PROBING ASSEMBLY WITH FIVE DEGREES OF FREEDOM

(71) Applicant: QualiTau, Inc., Mountain View, CA (US)

(72) Inventors: Mirtcha Lupashku, Sutter Creek, CA (US); Remy Orans, Piedmont, CA (US)

(73) Assignee: QualiTau, Inc., Santa Clara, CA (US)

( * ) Notice: Subject to any disclaimer, the term of this patent is extended or adjusted under 35 U.S.C. 154(b) by 355 days.

(21) Appl. No.: 15/847,754

(22) Filed: Dec. 19, 2017

(65) Prior Publication Data

US 2018/0172731 A1    Jun. 21, 2018

Related U.S. Application Data

(60) Provisional application No. 62/436,762, filed on Dec. 20, 2016.

(51) Int. Cl.
*G01R 1/067* (2006.01)
*G01R 31/26* (2020.01)
*G01R 31/28* (2006.01)
*G01R 1/073* (2006.01)

(52) U.S. Cl.
CPC ..... *G01R 1/06705* (2013.01); *G01R 31/2601* (2013.01); *G01R 31/2887* (2013.01); *G01R 1/07307* (2013.01); *G01R 31/2865* (2013.01)

(58) Field of Classification Search
CPC ............ G01R 1/06705; G01R 31/2887; G01R 31/2601; G01R 31/2865; G01R 1/07307
See application file for complete search history.

(56) References Cited

U.S. PATENT DOCUMENTS

| | | | | |
|---|---|---|---|---|
| 5,014,001 A | * | 5/1991 | Schmidt | G01R 1/06705 324/750.22 |
| 7,126,361 B1 | * | 10/2006 | Anderson | G01R 1/07342 324/750.08 |
| 9,653,332 B1 | * | 5/2017 | Tsironis | H01L 21/68707 |

(Continued)

FOREIGN PATENT DOCUMENTS

| | | |
|---|---|---|
| CN | 200979559 | 11/2007 |
| GB | 2526110 | 11/2015 |
| WO | WO 2009/050127 | 4/2009 |

OTHER PUBLICATIONS

Information Guide, Cascade Microtech, 2012 (Year: 2012).*

(Continued)

*Primary Examiner* — Daniel R Miller
(74) *Attorney, Agent, or Firm* — Beyer Law Group LLP

(57) ABSTRACT

A universal multi-pin, adjustable probing assembly or manipulator for use in parametric and reliability testing of devices on a semiconductor wafer. The probing assembly can be mounted and adjusted on a metal platen using a magnetic field. The strength of the magnetic field can be adjusted by a switchable magnetic slab to which a block is connected via an arm. A probe head can be attached to a side face of the block, which includes a tilt control mechanism for tilting the probe head to ensure that probe tips land simultaneously on pads of dies. The probe head also includes four adjusting mechanisms for translation in the X, Y, and Z directions, as well as rotation about the Z axis.

18 Claims, 5 Drawing Sheets

(56) References Cited

U.S. PATENT DOCUMENTS

2003/0042921 A1* 3/2003 Hollman ............ G01R 1/07392
　　　　　　　　　　　　　　　　324/750.14
2012/0268151 A1 10/2012 Zai et al.

OTHER PUBLICATIONS

International Search Report and Written Opinion dated May 7, 2018 from International Application No. PCT/US2017/067436.
Invitation to Respond to Written Opinion dated Jul. 20, 2020 from Singaporean Application No. 11201905450V.

* cited by examiner

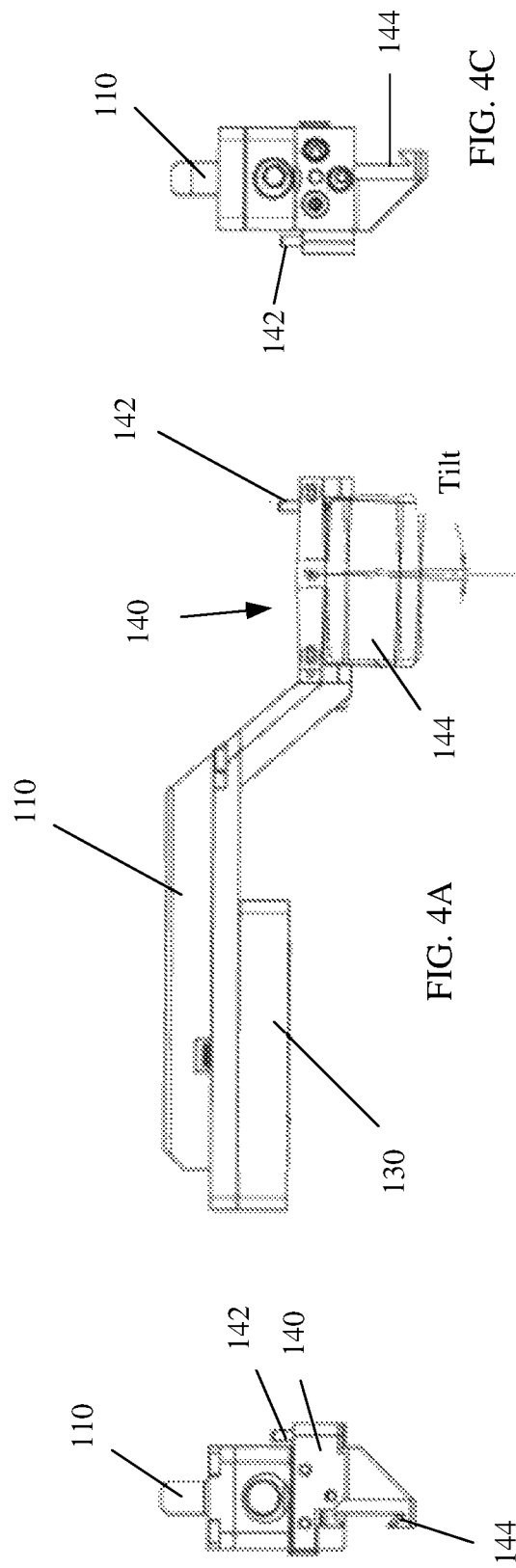

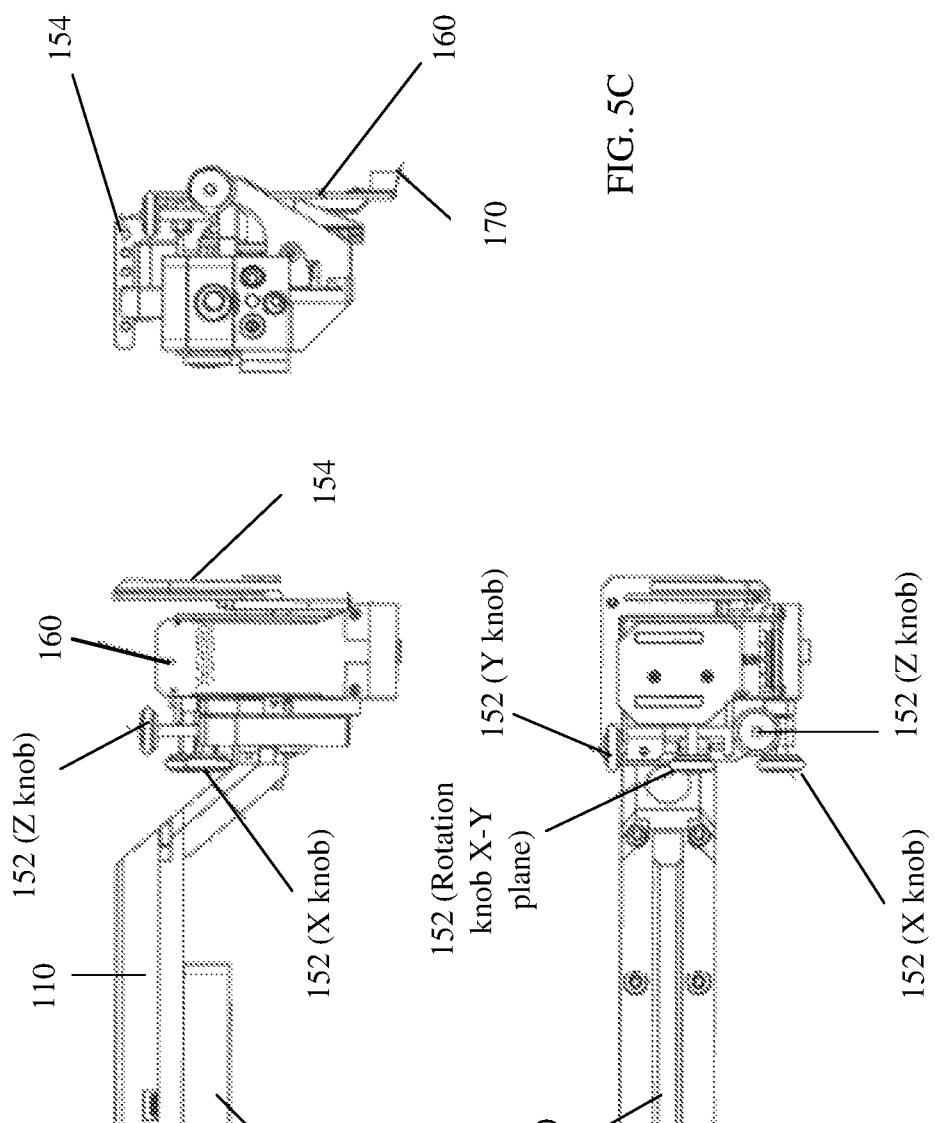

UNIVERSAL PROBING ASSEMBLY WITH FIVE DEGREES OF FREEDOM

RELATED APPLICATION

This application claims the benefit of U.S. Provisional Patent Application No. 62/436,762, filed on Dec. 20, 2016, and hereby incorporates herein the foregoing application for all purposes.

BACKGROUND

The present invention relates generally to wafer-level test equipment. More particularly, the present invention relates to a multi-pin, adjustable probing assembly or manipulator, for use in parametric and reliability testing of devices on a semiconductor wafer.

Wafer level testing and characterization typically require direct access to a number of pins on one or more devices on a tested semiconductor wafer, where each precision metal needle (probe) contacts a dedicated metal pad on the tested die. Access to a particular die requires accurate and reliable control of all the probes contacting the die, with respect to lateral movement across the wafer plane (X-Y), Z (height) adjustment, rotational adjustment about the Z-axis (i.e. in the X-Y plane), and rotation about the Y-axis (i.e. in the X-Z plane—hereinafter "tilt."). Therefore, it is desirable to provide a probe assembly that is capable of precise control.

SUMMARY

In accordance with an embodiment, a universal probing assembly is provided for parametric and reliability testing of devices on a semiconductor wafer. The assembly includes a switchable magnetic slab, a probe head, a block that includes a tilt control mechanism for allowing tilting of the probe head perpendicular to a X-Y plane of the wafer, and an arm having a first end and a second end. The first end of the arm is attached to the switchable magnetic slab and the second end of the arm is attached to the block. The probe head is mounted to the block and includes adjusting mechanisms.

According to another embodiment, a probing assembly is provided for parametric and reliability testing of devices on a semiconductor wafer. The assembly includes a switchable magnetic slab, a probe head having adjustment mechanisms, a block, an arm having a first end and a second end, and a metal platen to which the arm, block, and probe head can be mounted using a magnetic field between the switchable magnetic slab and the metal platen. The block includes a tilt control mechanism for allowing tilting of the probe head, which is mounted to the block. The first end of the arm is attached to the switchable magnetic slab and the second end of the arm is attached to the block.

According to yet another embodiment, a probing assembly is provided for parametric and reliability testing of devices on a semiconductor wafer. The assembly includes a switchable magnetic slab, a probe head including four adjusting mechanisms, a block, and an arm that connects the switchable magnetic slab and the block. The block includes a tilt control mechanism for allowing tilting of the probe head perpendicular to a X-Y plane of the wafer. The probe head is mounted to the block.

BRIEF DESCRIPTION OF THE DRAWINGS

The invention, together with further objects and advantages thereof, may best be understood by reference to the following description taken in conjunction with the accompanying drawings in which:

FIG. 4A is a front view of the block and arm of the universal probing assembly shown in FIG. 1.

FIGS. 4B and 4C are side view of the block and arm of the universal probing assembly shown in FIG. 1.

FIG. 4D is a top view of the block and arm of the universal probing assembly shown in FIG. 1.

FIG. 5A is a front view of the probe head and of the universal probing assembly shown in FIG. 1.

FIGS. 5B and 5C are side views of the probe head and of the universal probing assembly shown in FIG. 1.

FIG. 5D is a top view of the probe head and of the universal probing assembly shown in FIG. 1.

DETAILED DESCRIPTION OF EMBODIMENTS

The present invention relates generally to wafer-level test equipment. The embodiments herein describe a multi-pin, adjustable probing assembly or manipulator, for use in parametric and reliability testing of devices on a semiconductor wafer. The embodiments of the probing assembly provide adjustments with five degrees of freedom, as discussed in more detail below.

Figure 1:
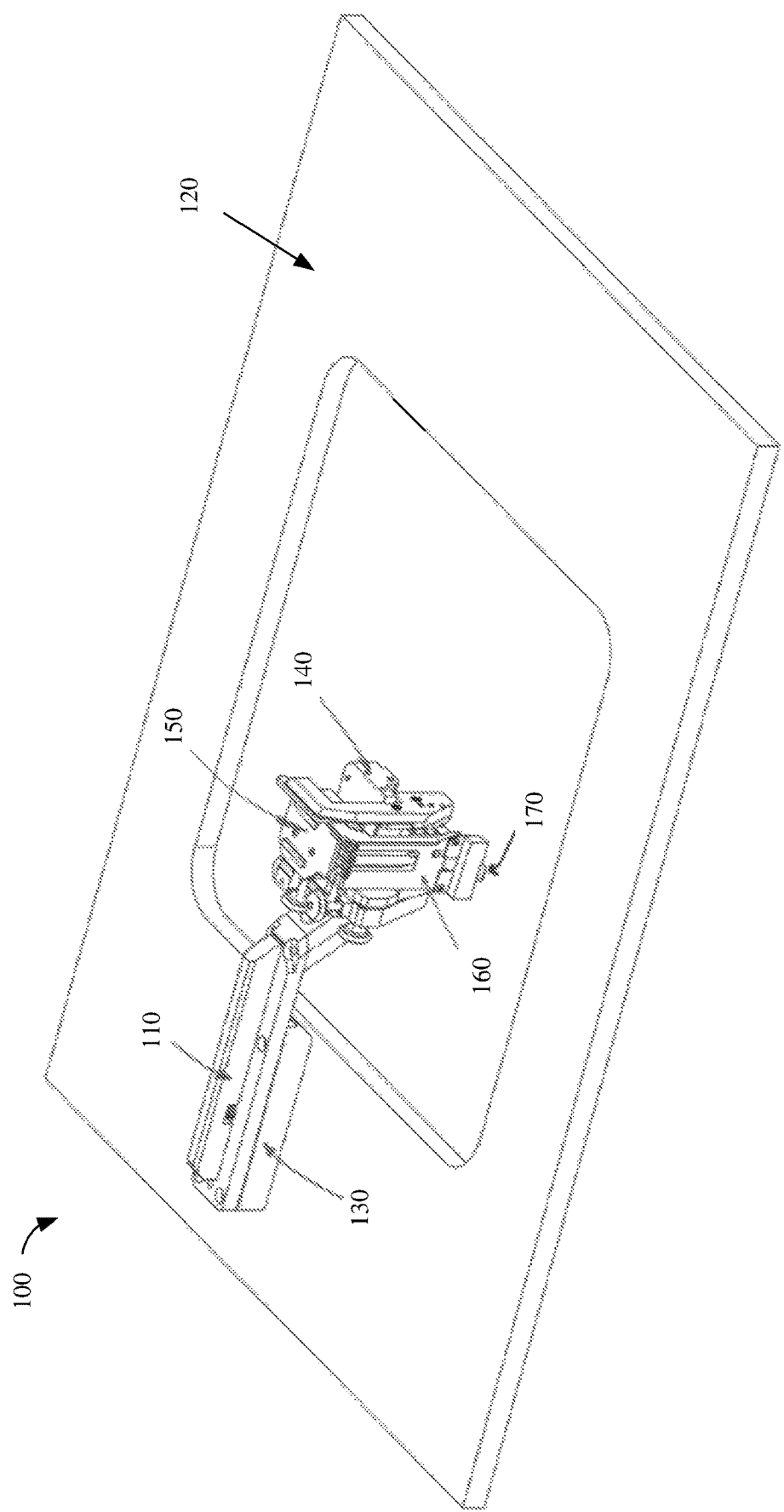
FIG. 1 is a perspective view of a universal probing assembly and platen in accordance with an embodiment.

Referring to FIGS. 1-5, embodiments of a universal probing assembly 100 will be described. In accordance with an embodiment, as shown in FIG. 1, a manipulator arm (hereinafter "arm") 110 is attached to a metal platen 120 by a magnetic force, via a switchable magnetic slab 130. As will be described in more detail below, a switch on the switchable magnetic slab 130 can be used to control the strength of the magnetic force between the arm 110 and the platen 120.

The arm 110 is attached to a rectangular connectivity and tilt-adjustment block (hereinafter "block") 140. According to an embodiment, the arm 110 is attached to the block 140 using precision screws. The block 140 can be attached to the arm 110 from any of three of its four side faces, while the remaining (fourth) side face is connected to a probe head (herein after "head") 150, which can be tilted. In the illustrated embodiment, the probe head 150 can be mounted on a dove-tail receptacle 144 on the fourth side face of the block 140, assuring both stable and repeatable action. Preferably, the arm 110 is formed from material having a minimal thermal coefficient of expansion.

In addition to the tilt adjustment mentioned above, the probe head 150 includes four additional adjustment mechanisms (i.e., X, Y, Z, and rotation about the Z-axis), where one of its sides is attached to a vertical probe card 160, which is described in U.S. Pat. No. 7,126,361 B1, which is hereby incorporated herein for all purposes. The probes 170 are connected to the bottom of the probe card 160, usually aligned in one or two rows. According to an embodiment, all five adjustment mechanisms are driven manually by the user, using the tilt control mechanism 142 and dedicated knobs 152. Once the position of the probes 170 is aligned with respective pads on a test die, the final Z-adjustment is made to assure proper mechanical and electrical contact between the probes 170 and the pads on the test die.

FIG. 1 is a perspective view of an embodiment of a universal probing assembly 100. As shown in FIG. 1, a switchable magnetic slab 130 is attached to an arm 110 and held on the metal platen 120 by its magnetic force. According to an embodiment, the switchable magnetic slab 130 can be attached to the arm 110 using screws. Using a switch on the magnetic slab 130, the magnetic force can be reduced, thus reducing the magnetic force to allow for easy positioning and adjustment with respect to the platen 120. Once the desired position is attained, the magnetic force can be increased by using the switch on the magnetic slab 130, thus resulting in a stronger magnetic force for holding the magnetic slab 130 on the platen 120 tightly and securely.

Figure 2:
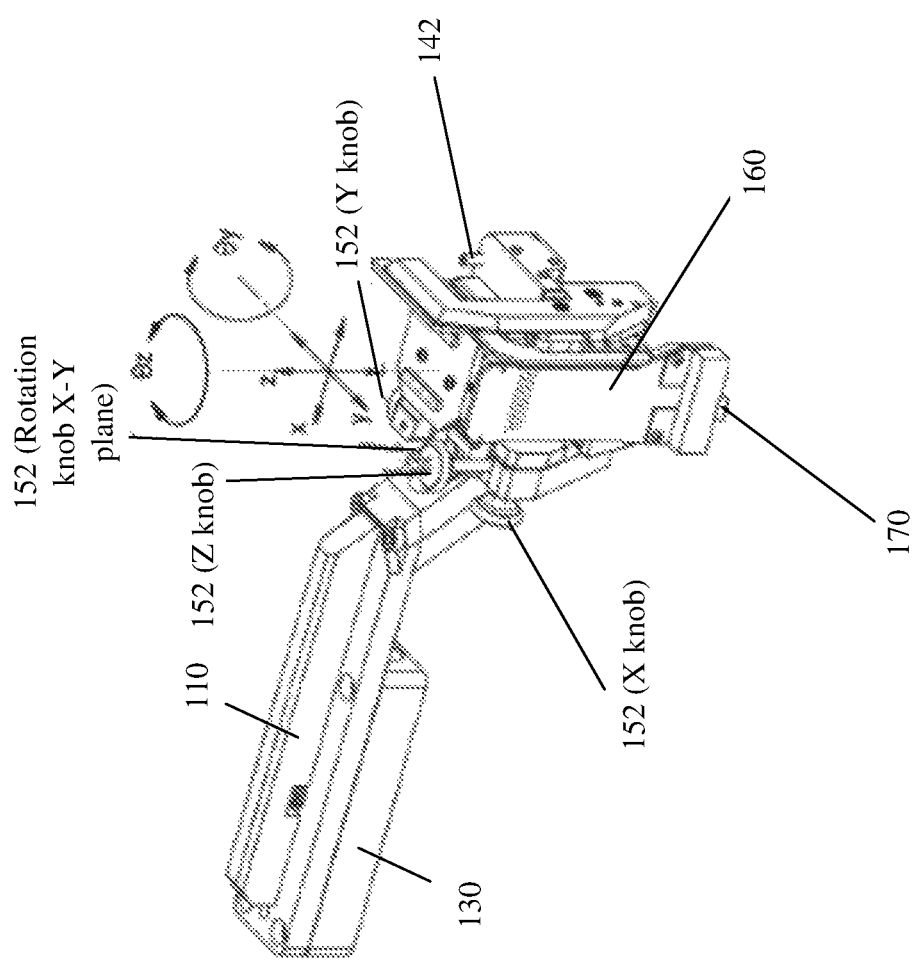
FIG. 2 is a perspective view of the universal probing assembly shown in FIG. 1, showing the three translational degrees of freedom X, Y, and Z, as well as the rotation in the X-Y plan (denoted $\Theta z$) and the tilt (denoted $\Theta y$).

FIG. 2 shows the probe assembly 100 shown in FIG. 1, in general, but without the platen 120. FIG. 2 also shows the three translational degrees of freedom X, Y, and Z, as well as the rotation in the X-Y plane (denoted Θz) and the tilt (denoted Θy) that is described above. As shown in FIG. 2, knobs 152 on the probe head 120 allow the user to adjust the probe head 150 in the X, Y, and Z directions, as well as rotationally about the Z-axis. As discussed above, the tilt control mechanism 142 can be used to tilt the probe head 150 about the Y-axis. Thus, the probe assembly 100 has five degrees of freedom.

Figure 3:
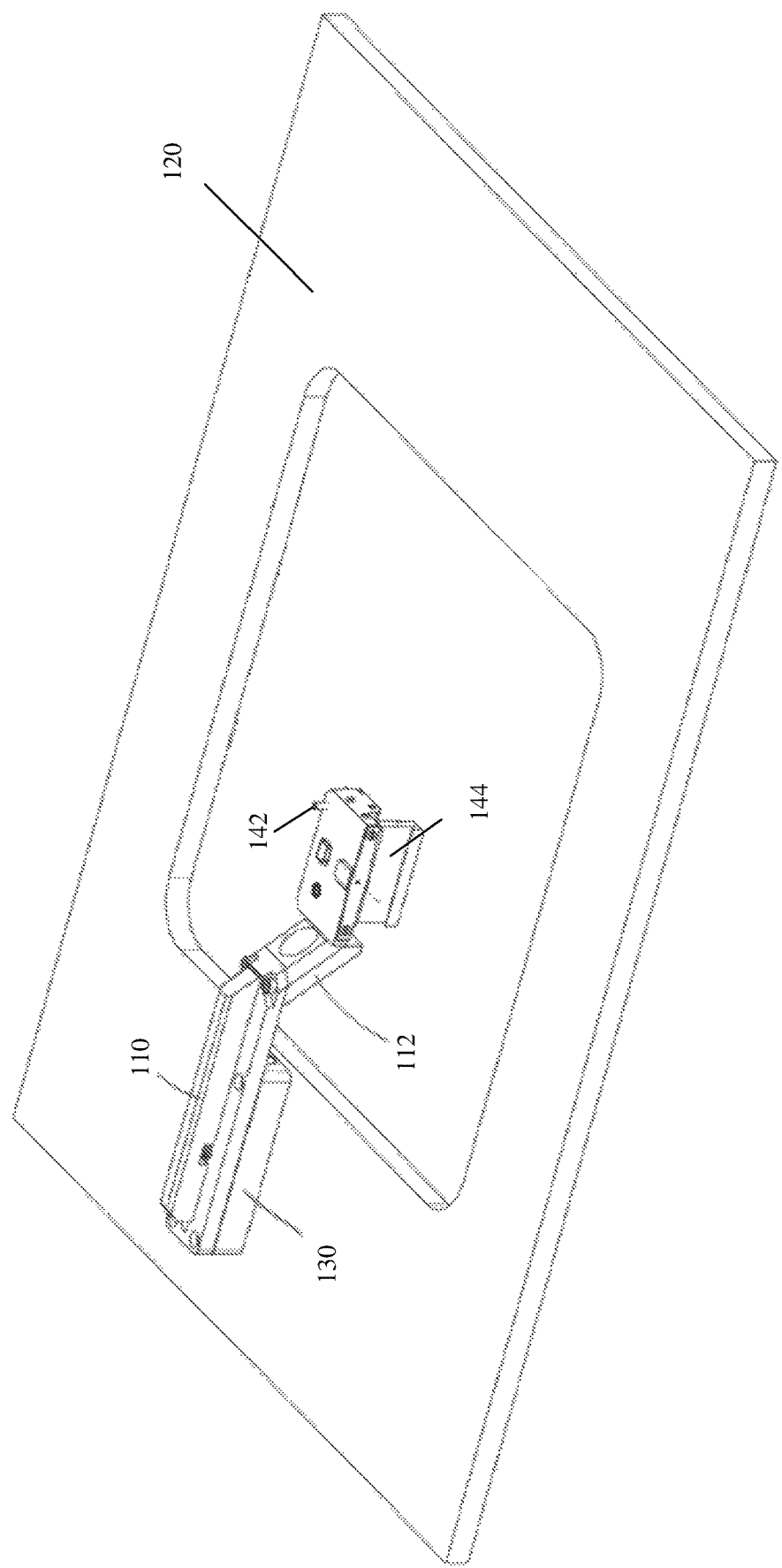
FIG. 3 is a perspective view of the universal probing assembly shown in FIG. 1, without a probe head and probe card.

FIG. 3 is a perspective view of the assembly shown in FIG. 1, without a probe head 150 and probe card 160. As shown in FIG. 3, the block 140 can be connected to a slanted portion 112 of the arm 110. It will be noted that the block 140 can be attached to the slanted portion 112 of the arm 110 on any of the block's three flat side faces (any of the side faces without the dove tail receptacle 144 attached). The ability to attach the arm 110 to any of the three side faces of the block 140 allows simultaneous testing of dice oriented either 180° or 90° with respect to each other, without moving blocks 140 to different positions on the platen 120. A tilt control mechanism 142 moves an inner metal part 148 inside the block 140 by exerting force on one side, while the other side is balanced by an opposing spring (not shown). The inner metal part 148, attached to the dove tail receptacle 144, is free to rotate about the axis perpendicular to the fourth side of the block 140. Thus, the tilt control mechanism 142 can be used to tilt the dove tail receptacle 144 or other attachment mechanism to which the probe head 150 is attached.

FIG. 4A shows a front view of the block 140 and arm 110, with the tilt control mechanism 142 of the inner part and the dove-tail receptacle 144 attached. FIGS. 4B and 4C are side views and FIG. 4D is a top view of the block 140 and arm 110. The tilting of the dove-tail receptacle 144 about the Y-axis is enabled by the two openings 146 on the top of the block 140, which allow the inner metal part to move accordingly.

FIGS. 5A-5D show various views of the probe head 150 and of the assembly 100. The probe head 150 is mounted on the block 140 via its dove tail receptacle 144. U.S. Pat. No. 7,126,361, which is hereby incorporated herein for all purposes, describes an embodiment of the probe head 150, where the locking mechanism and lever 154 locks the head 150 to its rail and releases it as necessary.

It will be understood that the lateral movement in the X and Y directions positions the probes 170 to the target die on the wafer, while the rotation about the Z-axis assures that all probes 170 are aligned with their intended pads, respectively. The block 140 allows tilting of the probe head 150 perpendicular to the wafer (X-Y) plane. The tilt of the probe head 150 assures that all tips of the probes 170 land simultaneously on their pads, by correcting a possible angle between the virtual line connecting the probe tips and the underlying wafer (X-Y) plane. The ability to attach the arm 110 to any of the three side faces of the block 140 allows simultaneous testing of dice oriented either 180° or 90° with respect to each other, without moving the probing assembly 100 to different positions on the platen 120. The multi-pin vertical probe enables multi-pad connectivity while minimizing heat transfer from the wafer to the probe head.

Although only a few embodiments have been described in detail, it should be appreciated that the invention may be implemented in many other forms without departing from the scope of the invention. In view of all of the foregoing, it should be apparent that the present embodiments are illustrative and not restrictive and the invention is not limited to the details given herein, but may be modified within the scope and equivalents of the appended claims.

What is claimed is:

1. A universal probing assembly for parametric and reliability testing of devices on a semiconductor wafer, the assembly comprising:
   a switchable magnetic slab;
   a probe head comprising four adjusting mechanisms, including for translation along a X-axis, a Y-axis, and a Z-axis, and for rotation about the Z-axis, wherein the X-axis, the Y-axis, and the Z-axis are perpendicular to one another;
   a block comprising a tilt control mechanism for allowing tilting of the probe head perpendicular to a X-Y plane of the wafer, wherein the probe head is mounted to the block; and
   an arm having a first end and a second end, wherein the first end is attached to the switchable magnetic slab and the second end is attached to the block, wherein the block can be attached to the arm using any one of three free side faces of the block, wherein each of the three free side faces is any side face of the block that is not an attachment side face on which the probe head is mounted.

2. The universal probing assembly of claim 1, wherein the switchable magnetic slab allows release of the arm, block, and probe head from the metal platen by reducing the magnetic field between the switchable magnetic slab and the metal platen.

3. The universal probing assembly of claim 1, wherein the tilt control mechanism comprises a movable part controlled by a screw to tilt the probe head.

4. The universal probing assembly of claim 3, wherein the probe head is attached to a dove-tail receptacle on the attachment side face of the block, wherein the dove-tail receptacle can be tilted by the movable part.

5. A universal probing assembly for parametric and reliability testing of devices on a semiconductor wafer, the assembly comprising:
   a switchable magnetic slab;
   a probe head comprising a plurality of adjusting mechanisms;
   a block comprising a tilt control mechanism for allowing tilting of the probe head perpendicular to a X-Y plane of the wafer, wherein the probe head is mounted to the block, wherein the tilt control mechanism comprises a movable part controlled by a screw to tilt the probe head, and wherein the probe head is mounted on an attachment side face of the block;
   an arm having a first end and a second end, wherein the first end is attached to the switchable magnetic slab and the second end is attached to the block, wherein the block can be attached to the arm using any one of three free side faces of the block, wherein each of the three free side faces is any side face of the block that is not the attachment side face on which probe head is mounted.

6. The universal probing assembly of claim 5, wherein the probe head is attached to a dove-tail receptacle on the attachment side face of the block, wherein the dove-tail receptacle can be tilted by the movable part.

7. The universal probing assembly of claim 5, wherein the probe head comprises four adjusting mechanisms, including for translation along a X axis, a Y-axis, and a Z-axis, and for rotation about a Z-axis, wherein the X-axis, the Y-axis, and the Z-axis are perpendicular to one another.

8. The universal probing assembly of claim 7, wherein the probe head is tiltable about the Y-axis.

9. The universal probing assembly of claim 5, wherein the probe head can be mounted on a rail-based system using a locking mechanism and lever.

10. A probing assembly for parametric and reliability testing of devices on a semiconductor wafer, the assembly comprising:
    a switchable magnetic slab;
    a probe head comprising four adjustment mechanisms, including for translation along a X-axis, a Y-axis, and a Z-axis, and for rotation about the Z-axis, wherein the X-axis, the Y-axis, and the Z-axis are perpendicular to one another;
    a block comprising a tilt control mechanism for allowing tilting of the probe head, wherein the probe head is mounted to the block;
    an arm having a first end and a second end, wherein the first end is attached to the switchable magnetic slab and the second end is attached to the block, wherein the block can be attached to the arm using any one of three free side faces of the block, wherein each of the three free side faces is any side face of the block that is not an attachment side face on which the probe head is mounted; and
    a metal platen to which the arm, block, and probe head can be mounted using a magnetic field between the switchable magnetic slab and the metal platen.

11. The universal probing assembly of claim 10, wherein the switchable magnetic slab comprises a switch for adjusting a strength of a magnetic field between the switchable magnetic slab and the metal platen.

12. The universal probing assembly of claim 11, wherein a stronger magnetic field mounts the magnetic slab, arm, and probe head more securely to the metal platen.

13. The probing assembly of claim 10, wherein the four adjusting mechanisms are knobs that can be manually adjusted.

14. The probing assembly of claim 13, wherein the probe head can be tilted about the Y-axis.

15. A probing assembly for parametric and reliability testing of devices on a semiconductor wafer, the assembly comprising:
    a switchable magnetic slab;
    a probe head comprising four adjusting mechanisms;
    a block comprising a tilt control mechanism for allowing tilting of the probe head perpendicular to a X-Y plane of the wafer, wherein the probe head is mounted to the block; and
    an arm that connects the switchable magnetic slab and the block, wherein the probe head is attached to a first side face of the block and the block can be attached to the arm on any of a first, second, or third side face of the block.

16. The probing assembly of claim 15, wherein the four adjusting mechanisms include mechanisms for translation along a X axis, a Y-axis, and a Z-axis, and for rotation about a Z-axis, wherein the X-axis, the Y-axis, and the Z-axis are perpendicular to one another.

17. The probing assembly of claim 15, further comprising a metal platen, wherein the switchable magnetic slab controls a strength of a magnetic field between the switchable magnetic slab and the metal platen.

18. The probing assembly of claim 15, wherein the tilt control mechanism comprises a movable part controlled by a screw to tilt probe head.

* * * * *